(12) United States Patent
Khan et al.

(10) Patent No.: US 7,436,044 B2
(45) Date of Patent: Oct. 14, 2008

(54) ELECTRICAL FUSES COMPRISING THIN FILM TRANSISTORS (TFTS), AND METHODS FOR PROGRAMMING SAME

(75) Inventors: Babar A. Khan, Hopewell Junction, NY (US); Chandrasekharan Kothandaraman, Hopewell Junction, NY (US); Kai Xiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 207 days.

(21) Appl. No.: 11/306,597

(22) Filed: Jan. 4, 2006

(65) Prior Publication Data

US 2007/0158781 A1 Jul. 12, 2007

(51) Int. Cl.
*H01L 29/00* (2006.01)
(52) U.S. Cl. .................................. 257/529; 257/350
(58) Field of Classification Search ................. 257/529, 257/369, 67, 69, 57, 65, 350, 391
See application file for complete search history.

(56) References Cited

U.S. PATENT DOCUMENTS

| | | | | |
|---|---|---|---|---|
| 3,673,679 | A | * 7/1972 | Carbajal et al. | ............. 438/227 |
| 4,695,856 | A | * 9/1987 | Warabisako et al. | .......... 257/49 |
| 5,401,685 | A | 3/1995 | Ha | |
| 5,770,892 | A | * 6/1998 | Chan et al. | ................... 257/393 |
| 5,972,782 | A | 10/1999 | Ostapenko | |
| 2001/0005020 | A1 | 6/2001 | Jinno et al. | |
| 2002/0004289 | A1 | 1/2002 | Gosain et al. | |

OTHER PUBLICATIONS

Brotherton, S. D. et al. "Laser Crystallised Poly-Si TFTs for AMLCDs." *Elsevier*, Thin Solid Films, vol. 337 (1999) 188-195.
Jackson, W. B. et al. "Hydrogen Diffusion in Polycrystalline Silicon Thin Films." *Appl. Phys. Lett.* vol. 61 No. 14 (1992) 1670-1672.
Choi, Kwon-Young et al. "Hydrogen Passivation on the Grain Boundary and Intragranular Defects in Various Polysilicon Thin-Film Transistors." *Jpn. J. Appl. Phys.* vol. 35 Part 1, No. 2B (1996) 915-918.

(Continued)

*Primary Examiner*—Mark Prenty
(74) *Attorney, Agent, or Firm*—Scully, Scott, Murphy & Presser, P.C.; H. Daniel Schnurmann

(57) ABSTRACT

The present invention relates to electrical fuses that each comprises at least one thin film transistor. In one embodiment, the electrical fuse of the present invention comprises a hydrogenated thin film transistor with an adjacent heating element. Programming of such an electrical fuse can be effectuated by heating the hydrogenated thin film transistor so as to cause at least partial dehydrogenation. Consequentially, the thin film transistor exhibits detectible physical property change(s), which defines a programmed state. In an alternative embodiment of the present invention, the electrical fuse comprises a thin film transistor that is either hydrogenated or not hydrogenated. Programming of such an alternative electrical fuse can be effectuated by applying a sufficient high back gate voltage to the thin film transistor to cause state changes in the channel-gate interface. In this manner, the thin film transistor also exhibits detectible property change(s) to define a programmed state.

18 Claims, 3 Drawing Sheets

OTHER PUBLICATIONS

Khan, Babar A. et al. "Effects of Hydrogen on the Off-State of Polysilicon Thin Film Transistors," *Mat. Res. Soc. Symp. Pro.* vol. 106 (1998) 353-358.

Khan, Babar A. et al. "Activation Energy of Source-Drain Current in Hydrogenated and Unhydrogenated Polysilicon Thin-Film Transistors." IEEE Trans. Elec. Dev. vol. 37 No. 7 (1990) 1727-1734.

Wang, Li-Ming et al. "Comparison of the Mechanisms of Hydrogenation by RF Plasma and SiNx." *Proceedings of SPIE* vol. 4079 (2000) 55-58.

Mitra, U. et al. "Mechanism of Plasma Hydrogenation of Polysilicon Thin Film Transistors." *J. Electrochem. Soc.* vol. 138 No. 11 (1991) 3420-3424.

* cited by examiner

ELECTRICAL FUSES COMPRISING THIN FILM TRANSISTORS (TFTS), AND METHODS FOR PROGRAMMING SAME

FIELD OF THE INVENTION

The present invention relates generally to programmable semiconductor devices, such as electrical fuses and/or anti-fuses. More specifically, the present invention relates to electrical fuses that each comprises at least one thin film transistor (TFT), as well as methods for programming such electrical fuses.

BACKGROUND OF THE INVENTION

Fuses and anti-fuses are programmable electronic devices that are used in a variety of circuit applications. A fuse is normally closed or has a relatively lower resistance to allow electric current flowing therethrough, and when blown or programmed, it becomes open or has an increased resistance. An anti-fuse, on the other hand, is normally open or has relatively high resistance, and when an anti-fuse is blown or programmed, this results in a short circuit or a decreased resistance.

There are many applications for fuses and anti-fuses. One particular application is for customizing integrated circuits (IC's) after production. One IC configuration may be used for multiple applications by programming the fuses and/or anti-fuses (e.g., by blowing or rupturing selected fuses and anti-fuses) to deactivate and select circuit paths. Thus, a single integrated circuit design may be economically manufactured and adapted for a variety of custom uses. Fuses and anti-fuses may also be used to program chip identification (ID) after an integrated circuit is produced. A series of ones and zeros can be programmed in to identify the IC so that a user will know its programming and device characteristics. Further, fuses and anti-fuses can be used in memory devices to improve yields. Specifically, fuses or anti-fuses may be programmed to alter, disconnect or bypass active cells or circuits and allow redundant memory cells to be used in place of cells that are no longer functional. Similarly, information may be rerouted using fuses and/or anti-fuses.

One type of fuse device is "programmed" or "blown" by using a laser to open a link after the semiconductor device is processed. This type of fuse device not only requires an extra processing step to program or "blow" the fuse devices where desired, but also requires precise alignment of the laser on the fuse device to avoid destroying neighboring devices.

Another type of fuse device is electrically programmable, which is usually referred to as an "e-fuse" or an "e-anti-fuse," by using a programming current or voltage that is higher than the circuit's normal operating current or voltage.

A conventional design for an e-fuse device includes a bottom polysilicon layer and a top metal silicide layer, which are patterned into two relatively wider contact regions that are electrically coupled together by a relatively narrower fuse region. Because metal silicide has a significantly lower sheet resistance than polysilicon, electrical current typically flows through the top metal silicide layer at an un-programmed state. Therefore, the resistance of the metal silicide layer determines the resistance of the e-fuse at such an un-programmed state. However, when a sufficiently large programming current is passed through the e-fuse, joule heating accumulated in the relatively narrower fuse region heats the metal silicide layer in the fuse region to a sufficiently high temperature, causing local agglomeration of the metal silicide layer in the fuse region and forming a discontinuity between the contact regions. The electric current is consequentially forced to flow through the underlying polysilicon layer instead, and the resistance of the e-fuse therefore increases significantly, due to the relatively higher sheet resistance of the polysilicon material. The increased resistance can be readily detected as indicative of a programmed state of the e-fuse.

However, programming of conventional e-fuses as described hereinabove requires relatively high power (e.g., $\geq 10$ mW per fuse) and high temperatures (e.g., $\geq 1000°$ C.), which increase the size the fuse and significantly limit the usability of such e-fuses in integrated circuit (IC) chips.

There is therefore a need for improved electrical fuses that can be programmed at lower temperatures with less power consumptions. There is also a need for improved electrical fuses that can be readily integrated into IC chips, especially for use in conjunction with complementary metal-oxide-semiconductor (CMOS) circuits. There is further a need for electrical fuse designs that can be fabricated using standard CMOS process with no or few additional processing steps.

SUMMARY OF THE INVENTION

The present invention, in one aspect, relates to a programmable semiconductor device, comprising:

a thin film transistor comprising a source region, a drain region, a channel region, and a gate electrode, wherein the source, drain, and channel regions of the thin film transistor are all located in a hydrogenated semiconductor thin film; and a heating element located adjacent to the thin film transistor for heating the hydrogenated semiconductor thin film.

The phrase "thin film" as used herein refers to a film or a layer having a thickness less than 1 µm, more preferably less than 100 nm, and most preferably less than 10 nm.

Preferably, the gate electrode of the thin film transistor is a back gate electrode located in a semiconductor substrate underneath the hydrogenated semiconductor thin film. Such a back gate electrode may have an upper surface that is co-planar with an upper surface of the semiconductor substrate. More preferably, the back gate electrode is formed in a doped (either n-type or p-type) well structure in the semiconductor substrate.

The hydrogenated semiconductor thin film in which the source, drain, and channel regions of the thin film transistor are all located preferably comprises polysilicon, amorphous silicon, germanium, silicon germanium, or gallium arsenide, among which polysilicon is particularly preferred.

The heating element may comprise any heating device suitable for heating microelectronic components located on a semiconductor substrate, including, but not limited to: resistive heaters, induction heaters, infrared heaters, heat exchangers, thermoelectric modules, micro-hotplates, etc. Preferably, the heating element of the present invention comprises a resistive heater located adjacent to the source, drain and channel regions of the thin film transistor in the same hydrogenated semiconductor thin film.

Another aspect of the present invention relates to a method for programming the programmable semiconductor device as described hereinabove, by heating the hydrogenated semiconductor film to a sufficient temperature to cause at least partial dehydrogenation therein. In this manner, the thin film transistor will exhibit detectable change(s) in one or more of its physical properties, thereby defining a programmed state of the semiconductor device.

Preferably, the thin film transistor exhibits detectable change(s) in its threshold voltage, carrier mobility, on current, and/or on resistance. More preferably, the thin film transistor exhibits a detectable change in its threshold voltage, which can be readily detected as indicative of the programmed state.

Further, the programming temperature required for practicing the present invention typically ranges from about 400° C. to about 900° C., and more preferably from about 400° C. to about 500° C. Therefore, the required programming temperature for the present invention is significantly lower than that required for programming conventional electrical fuse designs, which is usually over 1000° C.

In yet another aspect, the present invention relates to a slightly different semiconductor device, which comprises a source region, a drain region, a channel region, and a back gate electrode, wherein the back gate electrode of the thin film transistor is located in a semiconductor substrate and has an upper surface that is coplanar with an upper surface of the semiconductor substrate, and wherein the source, drain, and channel regions of said thin film transistor are all located in a semiconductor thin film over the semiconductor substrate.

Unlike the previously described semiconductor device, this slightly different semiconductor device does not require hydrogenation. However, such an un-hydrogenated semiconductor device can be readily programmed, by applying a sufficiently high back gate voltage to the back gate electrode to cause state changes in an interface between its back gate electrode and its channel region. Such interfacial state changes will in turn cause the semiconductor device, either hydrogenated or un-hydrogenated, to exhibit detectible changes in one or more of its physical properties to thereby define a programmed state of the semiconductor device.

The back gate voltage required for programming such a semiconductor device preferably ranges from about 0.5 V to about 5 V, and more preferably from about 1 V to about 2.5 V, and it can be further tailored for adaptation to specific application requirements.

In a further aspect, the present invention relates to a semiconductor device comprising a complementary metal-oxide-semiconductor (CMOS) circuit located on a semiconductor substrate, wherein the CMOS circuit comprises at least one n-type metal-oxide-semiconductor (n-MOS) device, at least one p-type metal-oxide-semiconductor (p-MOS) device, and at least one thin film transistor, wherein the at least one thin film transistor comprises a source region, a drain region, a channel region, and a back gate electrode located underneath the channel region, and wherein the at least one n-MOS device, said at least one p-MOS device, and the at least one thin film transistor are substantially co-planar.

Other aspects, features and advantages of the invention will be more fully apparent from the ensuing disclosure and appended claims.

BRIEF DESCRIPTION OF THE DRAWINGS

FIG. 2 shows a top view of such an TFT-based electrical fuse, while FIGS. 3-4 show respective cross-sectional views of the electrical fuse from lines I-I and II-II.

DETAILED DESCRIPTION OF THE INVENTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on or over the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention provides electrical fuse designs that can be operated at significantly lower temperatures than conventional e-fuse designs and are compatible with the standard CMOS fabrication process.

Specifically, the electrical fuse designs of the present invention include at least one thin film transistor (TFT) that can be readily fabricated using the standard CMOS process, and the physical properties of this TFT can be changed either by heating them at a relatively low temperature (e.g., from about 400° C. to about 500° C., and more typically at about 450° C. or less) or by applying a sufficiently high back gate voltage (e.g., from about 0.5 V to about 5 V, and more typically from about 1 V to about 2.5 V). Such a change in the physical properties of the TFT can be detected and functions as an indication that the electrical fuse has been programmed.

Although TFTs have been used extensively in liquid crystal display (LCD) industry, use of TFTs as electrical fuses is a new and unique aspect of the present invention.

Figure 1:
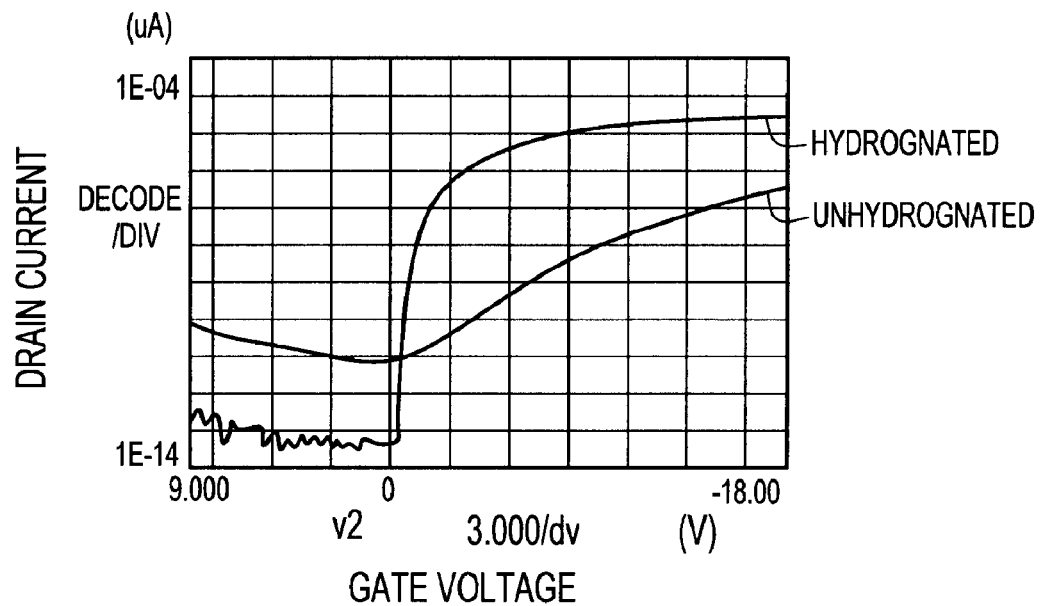
FIG. 1 shows the current responses of a hydrogenated TFT and an un-hydrogenated TFT, plotted as a function of the gate voltage applied thereto.

Polysilicon- and amorphous silicon-based TFTs have relatively high density of interface states at the channel-gate interfaces between the channels and the gate dielectric layers. Hydrogenation and/or thermal treatment of such TFTs can reduce the interface state density and thereby significantly improve the properties of the TFTs. For example, incorporation of hydrogen in a TFT may improve its threshold voltage, carrier mobility, on current, on resistance, sub-threshold slope, etc., because hydrogen functions to passivate the band tail and dangling bond states in the channel-gate interface of the TFT. FIG. 1 shows the current responses of a hydrogenated TFT and an un-hydrogenated TFT, which were plotted as a function of the gate voltage applied on such TFTs. It is clear that there are significant differences in threshold voltage, on current, sub-threshold slope between the hydrogenated TFT and the un-hydrogenated TFT.

Therefore, the present invention in one specific embodiment proposes an e-fuse design that includes a hydrogenated TFT and an adjacent heating element. One or more physical properties of a hydrogenated TFT, such as the threshold voltage, carrier mobility, on current, on resistance, etc., can be measured to define an un-programmed state of the e-fuse. When the hydrogenated TFT is heated by the heating element to a relatively low programming temperature, e.g., 400° C.-500° C., hydrogen is driven out of the TFT, and the dehydrogenated TFT exhibits significant changes in its physical properties, which can be readily detected to define a programmed state of the e-fuse.

An exemplary electrical fuse of the present invention as described hereinabove will now be illustrated in greater detail by referring to the accompanying FIGS. 2-4. Note that in these drawings, which are not drawn to scale, like and/or corresponding elements are referred to by like reference numerals. It is further noted that although only one thin film transistor and one heating element with a specific number of contacts arranged in a specific configuration are shown by such drawings, the present invention is not so limited and is intended to cover electrical fuses containing any specific number of thin film transistors and heating elements with any number of contacts arranged in any suitable configuration.

Figure 2:
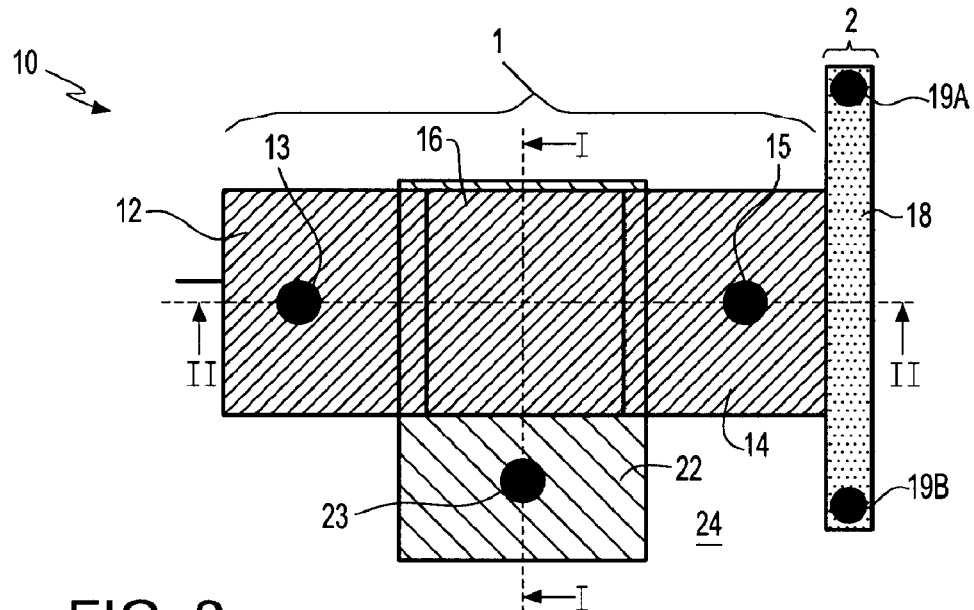
FIGS. 2-4 show an exemplary TFT-based electrical fuse, according to one embodiment of the present invention. Specifically.

Reference is first made to FIG. 2, which shows a top view of an exemplary electrical fuse 10, which contains a thin film transistor 1 and an adjacent heating element 2 located on a semiconductor substrate (not shown). The semiconductor substrate (not shown) may comprise any semiconductor material including, but not limited to: Si, SiC, SiGe, SiGeC, Ge alloys, GaAs, InAs, InP, as well as other III-V or II-VI compound semiconductors, and it may also be comprised of a layered semiconductor structure such as Si/SiGe, a silicon-on-insulator structure or a SiGe-on-insulator structure. In some embodiments of the present invention, it is preferred that the semiconductor substrate (not shown) be composed of a Si-containing semiconductor material, i.e., a semiconductor material that includes silicon. The semiconductor substrate (not shown) may be doped, undoped or contain doped and undoped regions therein (not shown), which is typically referred to as "wells".

The thin film transistor 1 comprises a source region 12, a drain region 14, a channel region 16 located between the source and drain regions 12 and 14, and a gate electrode 22. Respective source, drain, and gate contacts 13, 15, and 23 are also provided. The heating element 2 comprises a doped or undoped semiconductor strip 18 located between two terminal contacts 19A and 19B.

Figure 3:
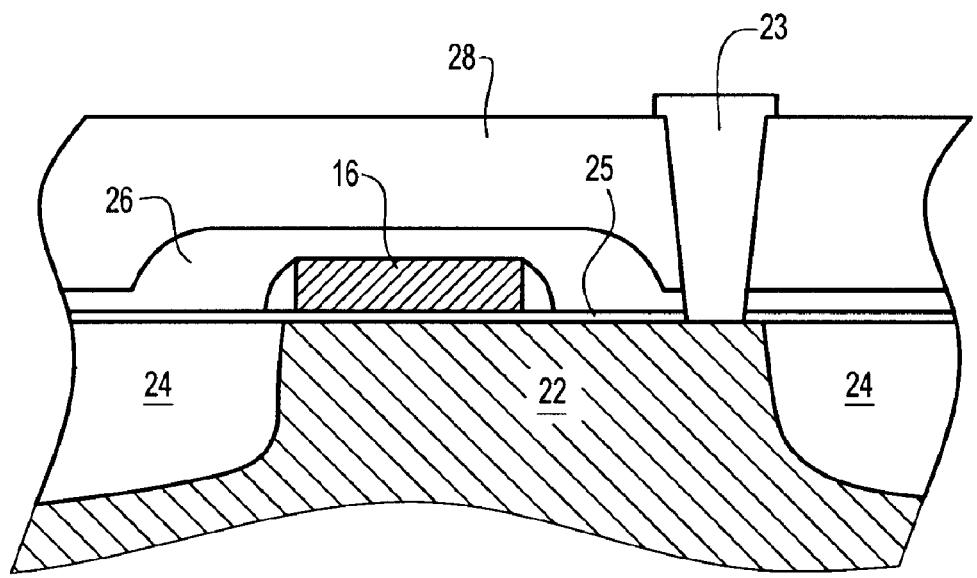

In a preferred but not necessary embodiment of the present invention, the gate electrode 22 is a back gate electrode, which is located in the semiconductor substrate (not shown) underneath the source, drain, and channel regions 12, 14, and 16 of the thin film transistor 1 and is surrounded by shallow trench isolation (STI) regions 24, as shown in FIG. 3. More preferably, the upper surface of the back gate electrode 22 is coplanar with the substrate surface. Such a back gate electrode 22 can be readily formed by the standard CMOS processing steps that are typically used for forming doped well structures (either n-wells or p-wells), and the STI regions 24 surrounding the back gate electrode 22 can be formed by the standard CMOS processing steps typically used for forming STI structures needed in the CMOS devices. Further, the gate dielectric layer 25, which isolates the back gate electrode 22 from the channel region 16 of the thin film transistor 1, can be readily fabricated by the standard CMOS processing step used for forming gate dielectric over the substrate, and no additional processing steps are required. The gate dielectric layer 25 comprises an insulating material including, but not limited to: oxides, nitrides, oxynitrides. In a preferred but not necessary embodiment, the gate dielectric layer 25 comprises an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

Figure 4:
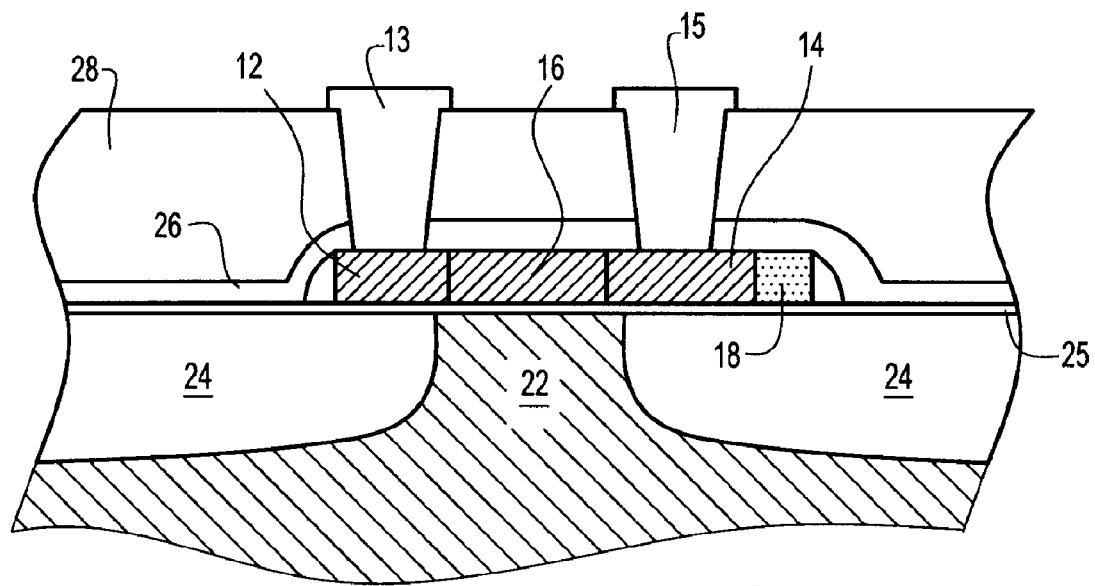

Further, the source, drain, and channel regions 12, 14, and 16 of the thin film transistor 1 are preferably formed by the same semiconductor thin film, as shown in FIG. 4. Any suitable semiconductor material, such as polysilicon or amorphous silicon, can be deposited over the gate dielectric layer 25, using the standard CMOS processing steps used for forming the polysilicon or amorphous silicon gate. However, unlike the standard CMOS process, the deposited polysilicon or amorphous silicon thin film is used in the present invention to form the source, drain, and channel 12, 14, and 16 of the thin film transistor 1, instead of the gate. The source and drain regions 12 and 14 can be formed by the source/drain implantation step commonly used in the CMOS process.

Hydrogenation of the semiconductor thin film in which the source, drain, and channel regions 12, 14, and 16 of the thin film transistor 1 are located can be carried out by various known processes, including, but not limited to: hydrogen plasma treatment, hydrogen implantation, and out-diffusion of hydrogen from a hydrogen source layer, such as a hydrogen-containing silicon nitride layer formed by a plasma enhanced chemical vapor deposition (PECVD) process.

Preferably, as shown in FIGS. 3 and 4, a hydrogen-containing silicon nitride layer 26 is deposited over the entire structure by a PECVD process, which is subsequently annealed at an anealing temperature ranging from about 100° C. to about 300° C. to cause hydrogen out-diffusion from the hydrogen-containing silicon nitride layer 26 into the semiconductor thin film in which the source, drain, and channel regions 12, 14, and 16 are located. Because standard CMOS devices are also covered by silicon nitride capping layers formed by PECVD processes, use of the PECVD silicon nitride layer 26 as the hydrogen source for hydrogenation of the thin film transistor 1 does not require any additional processing steps beyond those already included in the standard CMOS process, and therefore can be easily integrated into the standard CMOS process. Further, the thin film transistor 1 can be protected by the silicon nitride film 26 and will remain stable through the subsequent back-end-of-line (BEOL) thermal processing steps typically required for CMOS device fabrication.

The heating element 2 is located adjacent to, and preferably is in contact with, the thin film transistor 1 and is used for programming the thin film transistor 1 by heating it to a sufficiently high temperature to cause dehydrogenation therein. In a preferred but not necessary embodiment of the present invention, the heating element 2 is located in the same semiconductor thin film as the source, drain, and channel regions 12, 14, and 16 of the thin film transistor 1.

Specifically as shown in FIG. 2, a semiconductor thin film (marked by the shaded area) is patterned into a T-shaped semiconductor thin film structure. The horizontal shoulder region of such a T-shaped structure is used for forming the heating element 2, while the vertical leg region of such a T-shaped structure is used for forming the source, drain, and channel regions 12, 14, and 16 of the thin film transistor 1.

If doped, the horizontal shoulder region of such a T-shaped semiconductor thin film structure functions as a resistive element for producing joule heat from electric currents that flow thereby. On the other hand, if the horizontal shoulder region of such a T-shaped structure is undoped, a surface metal silicide layer is provided to allow flow of electric currents thereby for resistive heating. The joule heat produced by the heating element 2 at the horizontal shoulder region of the T-shaped semiconductor thin film structure is then transferred to the thin film transistor 1 at the vertical leg region through thermal conduction, so as to effectuate dehydrogenation of the thin film transistor 1.

The heating element 2 as shown hereinabove can be formed in the standard doped polysilicon gate commonly used in the CMOS process. Depending on the type of thin film transistor, either boron or phosphorus can be used as the dopant at a concentration of about $1 \times 10^{23}/cm^3$. The sheet resistivity of the heating element 2 is about 330 Ω/square.

As mentioned hereinabove, dehydrogenation of the thin film transistor 1 will cause it to exhibit detectable changes in one or more of its physical properties, such as threshold voltage, carrier mobility, on current, on resistance, etc., which can be detected for establishing the programmed status of the e-fuse 10. For example, on current of the thin film transistor 1 can be used for detecting the programmed state of the e-fuse 10.

Further, thermal annealing itself may alter the density of interface states at the channel-gate interface in the thin film transistor 1, which also contributes to changes in the threshold voltage, carrier mobility, and sub-threshold slope of the thin film transistor 1.

The temperature needed for programming the exemplary e-fuse 10 as described hereinabove typically ranges from about 400° C. to 500° C., which is significantly lower than that required for programming conventional e-fuses that contains metal silicide, and which will not cause any physical damage to the thin film transistor 1. Therefore, the e-fuse of the present invention can be fabricated in a more compact manner and is more power efficient and more reliable than conventional e-fuses.

In an alternative embodiment of the present invention, the present invention proposes an e-fuse design that includes a TFT, either hydrogenated or un-hydrogenated, with no adjacent heating element. It has been discovered that by applying a sufficiently high back gate voltage (e.g., 0.5 V to 5 V, or 1 V to 2 V), a thin film transistor, either hydrogenated or un-hydrogenated, will also exhibit a detectable change in its threshold voltage, due to changes in the interface states caused by the high back gate voltage, which can be used also for established a programmed state of the thin film transistor. More importantly, this embodiment allows programming of the e-fuse at even lower temperatures (e.g., <200° C.) and does not require any specific heating element.

Specifically, the large density of trap states available at the polysilicon grain boundaries and at the polysilicon/gate oxide interface leads to large changes in the electric properties of the hydrogenated or un-hydrogenated TFT when the states are occupied, as opposed to when they are not. The trap states can be passivated by hydrogen, which allows programming of the device as a fuse by de-passivating the states either using heat or by passing large currents through the source/drain of the TFT. The large density of trap states at the polysilicon/ oxide interface can also be altered by applying high electrical fields. The high electrical fields can be generated by either high gate/source voltage or high gate/drain voltage.

Figure 5:
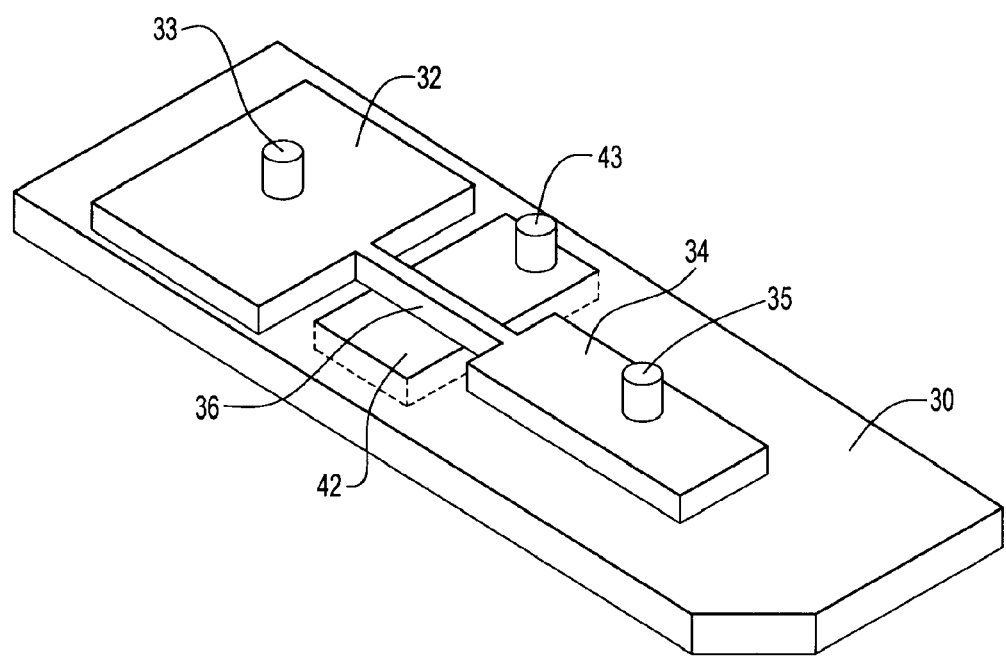
FIG. 5 shows a perspective view of an exemplary TFT-based electrical fuse, according to one embodiment of the present invention.

FIG. 5 shows a perspective view of an e-fuse according to such an alternative embodiment, which comprises a thin film transistor located on a semiconductor substrate 30. The semiconductor substrate 30 can be part of a larger integrated circuit device, and it may include various additional layers (not shown). The thin film transistor comprises a source region 32, a drain region 34, a channel region 36, which are all located in a continuous semiconductor film over the semiconductor substrate 30, and a back gate electrode 42 that is located in the semiconductor substrate 30. Respective source, drain, and gate contacts 33, 35, and 43 are also provided. Further, a gate dielectric layer (not shown) is provided between the channel region 36 and the back gate electrode 42. The back gate electrode 42 is preferably fabricated by a doped well structure in the semiconductor substrate 30 and has an upper surface that is coplanar with that of the semiconductor substrate 30. The doping level in the back gate electrode 42 is similar to the doping levels typically used for wells, i.e., from about $1 \times 10^{17}/cm^3$ to $1 \times 10^{18}/cm^3$.

The channel region 36 is preferably, but not necessarily, narrower than the source and drain regions 32 and 34, as shown in FIG. 5, so that the application of a sufficient high back gate voltage and the application of a large source voltage will cause a large current to flow, which will cause localized heating in the channel region 36, so as to effectuate interface state changes in the channel-gate interface between the channel region 36 and the back gate electrode 42. Still another effect is that the application of high gate voltage will lead to high fields near the source/drain regions 32 and 34, which will alter the density of defect states and therefore change the properties of the TFT. Correspondingly, the detectible changes in the TFT properties can be used to establish a programmed state of the TFT-based e-fuse. Further, the TFT property changes can be caused by both effects.

The back gate voltage required for programming such an e-fuse ranges from about 0.5 V to about 5 V, more typically from about 1 V to about 2 V, which is compatible with the current power requirement for standard CMOS devices. More importantly, the e-fuse can be readily modified to further reduce the required programming voltage for adaptation to specific system requirements.

The present invention not only provides new TFT-based e-fuse designs that can be programmed at lower temperatures with less power consumptions, but also enables integration of TFTs, which were typically used in LCD devices, into CMOS circuits for controlling n-MOS devices and p-MOS devices. More importantly, the TFTs of the present invention can be integrated into the CMOS circuits as substantially co-planar with the n-MOS and p-MOS devices therein, resulting in a simplified and compact semiconductor device structure that can be manufactured and packaged at significantly reduced costs.

While FIGS. 2-5 illustratively demonstrate an exemplary electrical fuse structure, according to a specific embodiment of the present invention, it is clear that a person ordinarily skilled in the art can readily modify the electrical fuse structure illustrated herein, for adaptation to specific application requirements, consistent with the above descriptions. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A programmable semiconductor device comprising:
   a thin film transistor comprising a source region, a drain region, a channel region, and a gate electrode, wherein the source, drain, and channel regions of said thin film transistor are all located in a hydrogenated semiconductor thin film; and
   a heating element located adjacent to the thin film transistor for heating the hydrogenated semiconductor thin film.

2. The programmable semiconductor device of claim 1, wherein the gate electrode of the thin film transistor is a back gate electrode that is located in a semiconductor substrate underneath the hydrogenated semiconductor thin film.

3. The programmable semiconductor device of claim 2, wherein the back gate electrode has an upper surface that is coplanar with an upper surface of the semiconductor substrate.

4. The programmable semiconductor device of claim 2, wherein the back gate electrode is located in a doped well structure in the semiconductor substrate.

5. The programmable semiconductor device of claim 1, wherein the hydrogenated semiconductor thin film comprises at least one semiconductor material selected from the group consisting of poly-silicon, amorphous silicon, germanium, silicon germanium, gallium arsenide, and combinations thereof.

6. The progranixnable semiconductor device of claim 1, wherein the heating element comprises a resistive heater located in the hydrogenated semiconductor thin film and adjacent to the source, drain, and channel regions of the thin film resistor.

7. The programmable semiconductor device of claim 6, wherein said resistive heater comprises at least two electrical contacts with a doped region of the hydrogenated semiconductor thin film therebetween.

8. The programmable semiconductor device of claim 6, wherein said resistive heater comprises at least two electrical contacts with a doped or undoped region of the hydrogenated semiconductor thin film therebetween, and wherein said doped or undoped region contains a metal suicide surface layer.

9. A method for programming the programmable semiconductor device as described in claim 1, comprising heating the hydrogenated semiconductor thin film to a sufficient temperature to cause at least partial dehydrogenation Therein, so that the thin film transistor exhibits detectible change(s) in one or more of its physical properties, thereby defining a programmed state.

10. The method of claim 9, wherein said one or more physical properties are selected from the group consisting of threshold voltage, carrier mobility, on current, and on resistance.

11. The method of claim 9, wherein the hydrogenated semiconductor thin film is heated to a temperature ranging from about 400° C. to about 900° C.

12. The method of claim 9, wherein the hydrogenated semiconductor thin film is heated to a temperature ranging from about 400° C. to about 500° C.

13. A method for programming a semiconductor device having a source region, a drain region, a channel region, and a back gate electrode, wherein the back gate electrode is located in a semiconductor substrate and has an upper surface that is coplanar with an upper surface of said semiconductor substrate, and wherein the source, drain, and channel regions are all located in a semiconductor thin film over the semiconductor substrate, said method comprising:
applying a sufficiently high back gate voltage to the back gate electrode to cause state changes in an interface between the back gate electrode and the channel region, so that said semiconductor device exhibits detectible change(s) in one or more of its physical properties, thereby defining a programmed state.

14. The semiconductor device of claim 13, wherein the back gate electrode is located in a doped well structure in the semiconductor substrate.

15. The semiconductor device of claim 13, wherein the semiconductor thin film comprises at least one semiconductor material selected from the group consisting of poly-silicon, amorphous silicon, germanium, silicon germanium, gallium arsenide, and combinations thereof.

16. The method of claim 13, wherein said one or more physical properties are selected from the group consisting of threshold voltage, carrier mobility, on current, and on resistance.

17. The method of claim 13, wherein said back gate voltage ranges from about 0.5 V to about 5 V.

18. The method of claim 13, wherein said back gate voltage ranges from about 1 V to about 2.5 V.

* * * * *